United States Patent [19]

Rilling

[11] Patent Number: 4,752,969
[45] Date of Patent: Jun. 21, 1988

[54] ANTI-MULTIPATH SIGNAL PROCESSOR

[76] Inventor: Kenneth Rilling, 1190 Crestline Dr., Cupertino, Calif. 95014

[21] Appl. No.: 819,416

[22] Filed: Jan. 16, 1986

[51] Int. Cl.$^4$ ............................. H04B 1/06; G01S 3/16
[52] U.S. Cl. ...................................... 455/278; 455/273; 342/380; 342/383
[58] Field of Search ............... 455/272, 273, 275, 276, 455/137, 139, 278, 283; 342/380, 383

[56] References Cited

U.S. PATENT DOCUMENTS

| | | | |
|---|---|---|---|
| 4,079,379 | 3/1978 | Piesinger | 342/380 |
| 4,097,866 | 6/1978 | Frost et al. | 342/380 |
| 4,161,733 | 7/1979 | Piesinger | 342/380 |
| 4,280,128 | 7/1981 | Masak | 342/380 |
| 4,635,063 | 1/1987 | Chang et al. | 342/383 |

Primary Examiner—Robert L. Griffin
Assistant Examiner—Curtis Kuntz
Attorney, Agent, or Firm—Allston L. Jones

[57] ABSTRACT

Signal processing that reduces multipath in communication receivers is implemented with an adaptive array. The invention address a signal environment in which the directions of arrival and the time of arrival of the signal of interest and the unwanted multipath are unknown. A reference signal is generated by amplitude limiting the adaptive array output signal. The system uses the strongest received signal as the signal of interest and rejects the others by placing an antenna pattern null in their direction of arrival.

28 Claims, 10 Drawing Sheets

ANTI-MULTIPATH SIGNAL PROCESSOR

BACKGROUND

To get high quality reception, communication systems, which include radio and television, require a strong signal that is not corrupted by noise or interference. One form of interference that can severely degrade reception is multipath. Multipath occurs when the transmitted signal arrives at the receiver simultaneously from more than one direction. The multiple paths are generally due to reflections of the transmitted signal from hills, buildings, etc.; they can also be the result of atmospheric phenomena. The indirect paths are longer than the direct path, and consequently, the indirect path signals arrive at the receiver later in time than the corresponding direct path signal. This makes them arrive at the receiver with a different phase than the direct path signal, and, consequently, causes distortion in both the phase and the amplitude of the received signal. This can result in deep signal strength fades, overlapping communication data, clicking, etc. Examples of multipath distortion are ghosts on TV, degraded fidelity in commercial FM stereo, and loss of data in communication links.

Designing the antenna pattern gain characteristics to reject the indirect paths by placing a null in their direction of arrival is one of the better approaches to reducing multipath distortion. This eliminates the indirect paths altogether. It is easy to accomplish when conditions are known and do not change. But in most communication situations, conditions do change. The adaptive array has been used to automatically change the antenna pattern as the conditions change.

In applying an adaptive array to the general communications problem where the direction of arrival (DOA) and the time of arrival (TOA) of the signal of interest are unknown, the comparison of the adaptive array output signal to a reference signal is well suited, of which, the least means squared error algorithm (LMS) is a simple, well known example. For optimal results, the LMS adaptive array requires a reference signal which is a replica of the signal of interest. In practice, a reference signal that is more correlated with the signal of interest than the interference signal is used.

Generation of the reference signal can pose a problem. In practice, a replica of the transmitted signal is not available at the receiver. The reference signal must be derived from the adaptive array output signal. Robert Riegler and Ralph Compton (Proceedings of the IEEE, Vol. 61, No. 6, June 1973, p. 748) have discussed the application of the adaptive array to amplitude modulated communications signals, where the adaptive array output signal is processed to generate a representation of the carrier of the transmitted signal for use as the reference signal. This approach does not require knowledge of the desired signal DOA or TOA. But this approach addresses the jammer type interference problem with which the adaptive array generally is associated, not the multipath problem.

R. T. Compton and D. M. DiCarlo (IEEE Transactions on Aerospace and Electronic Systems, VOL-AES-14, NO. 4, July 1978, p.599) and Y. Bar-Ness (IEEE Transactions on Aerospace and Electronic Systems, Vol.AES-18, No. 1, January 1982, p.115) analyze another adaptive array which uses the array output to generate the reference signal. But their system was designed to address a signal environment in which the signal of interest is received along with a wideband interference signal. They do not address the multipath problem.

Ralph Compton (Proceedings of the IEEE, Vol. 66, No. 3, March 1978, p.289) discusses an adaptive array for communication signals using a spread spectrum technique. The adaptive array uses knowledge of the spreading code to generate a reference signal. August McGuffin (U.S. Pat. No. 4,217,586) has extended this approach by utilizing the multipath in the reference signal generation. The pseudo random (PN) code based reference signal generator can keep lock even in severe multipath fading. But both these approaches require a known PN code be present in the transmitted signal to generate a reference signal.

G. H. Persinger (1977 International Conference on Communications, IEEE, Pt. III, Chicago, Ill., 12-15 June, 1977, Pp. 259-262) has used a low level PN code placed in quadrature (90 degrees out of phase) with transmitted AM signal. It is used to generate the reference signal at the receiver. The reference generation is dependent on the injection of this special signal with a known code.

Peder Hansen (IEEE Transactions on Antennas and Propagation, Vol.AP-29, No. 6 November 1981, p. 836) has placed a special modulated pilot signal in the transmitted signal to be used to generate the reference signal. This technique was used specifically to discriminate against multipath. But it does not work without the special tone.

Gayle Martin (U.S. Pat. No. 4,255,791) uses noise decorrelation to generate a reference signal for an adaptive array. This method addresses an environment where there is a large interfering signal, not the multipath environment.

In a related technology, transversal filters (single input adaptive filters) which reduce TV ghosts by signal processing (not by using the antenna pattern) use portions of the transmitted TV signal structure to generate the reference signal (Shri Goyal, others, IEEE Transactions on Consumer Electronics, Vol.CE-26, February 1980). Transversal filters remove the ghosts after the received signal has been demodulated. But, they are generally microprocessor or computer based and, consequently, quite complicated and expensive.

To summarize, the prior art is limited. It either does not address the multipath problem or its approach to a solution of the problem is complex or requires special tones or codes in the transmitted signal. And consequently, there is no effective and inexpensive method of removing multipath interference at the communications receiver.

SUMMARY OF INVENTION

The object of this invention is to reduce the magnitude of multipath indirect path signals which cause distortions such as fading, data overlap, multiple images, and clicking in communication receivers. An adaptive array is used to reject unwanted signals by spatial filtering; an antenna pattern null is placed in the direction of arrival of the unwanted signals. A second object of this invention is to reduce the negative effects of other types of interference signals with amplitudes less than the amplitude of the desired signal by rejecting them also. The invention does this for a signal environment in which the TOA and the DOA of the desired signal and indirect path/interference signals are unknown and for which the transmitted desired signal contains no known codes, pilot signals, or signal waveform structures. It is accomplished by obtaining the reference signal required by this class of adaptive arrays through the amplitude limiting of the array output signal.

DETAILED DESCRIPTION

Before describing the preferred embodiment of the invention in detail, a discussion of adaptive arrays, multipath theory, and the theory, function and generation of the reference signal required by the class of adaptive arrays used to solve the multipath problem will be presented to facilitate the understanding of this invention.

ADAPTIVE ARRAY

Interference signals and multipath create different signal environments for a communications receiver. Multipath occurs when the transmitted signal of interest arrives at the receiver simultaneously from more than one direction. An interference source is a signal source unrelated to the communications system, such as a jammer, that may or may not have the same frequency as the signal of interest. Historically, adaptive arrays were developed to reject interference signals. More recently, adaptive arrays have been shown capable of rejecting multipath.

An adaptive array is an antenna array that has adjustable weights in each of the antenna elements and automatically adjusts the weights to the proper values that reject the unwanted multipath or interference signals. The weights can be amplitude scale factors multiplying the antenna element signals or implementations that are equivalent to this.

Figure 1:
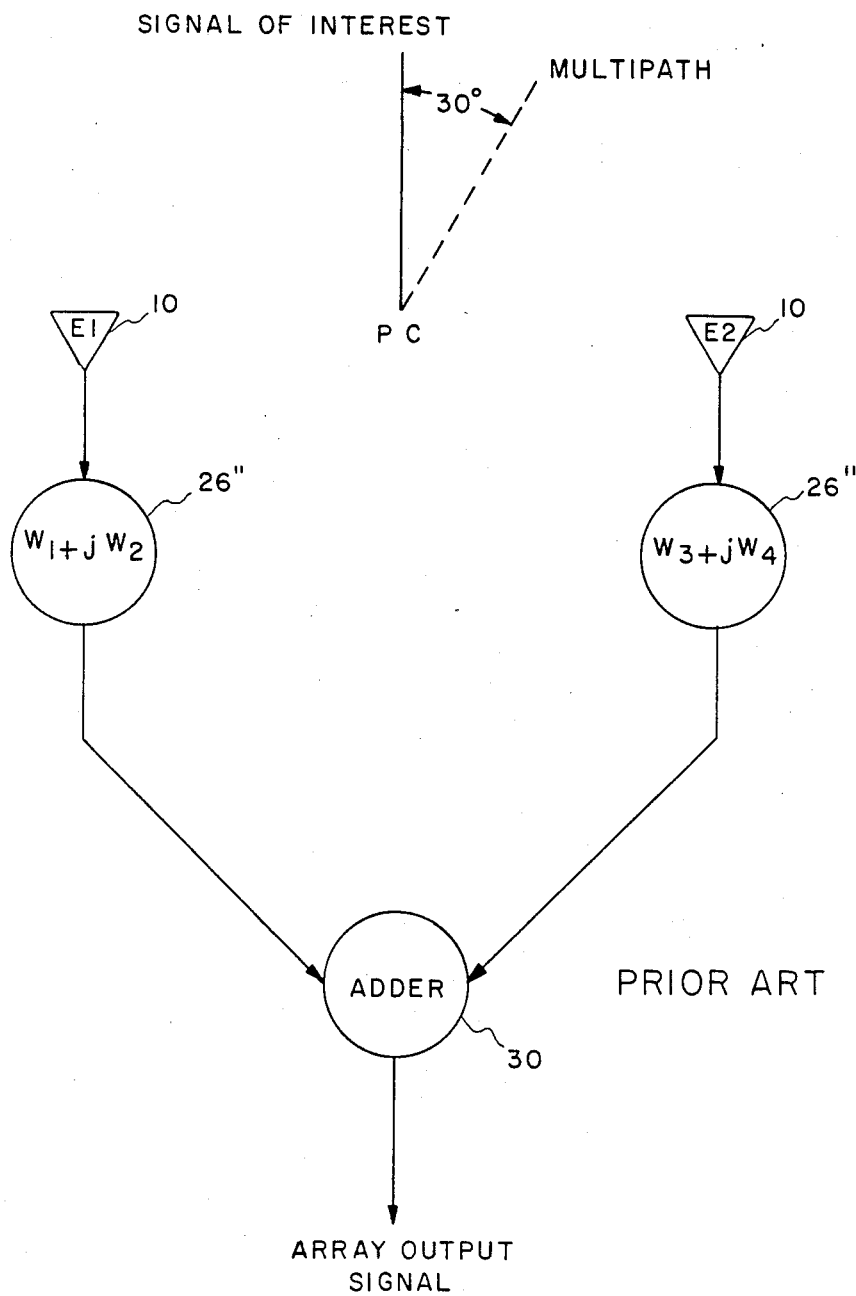
FIG. 1 is a block diagram of a two element array for the suppression of multipath and interference: prior art.

To demonstrate the way in which an array with adjustable weights can reject indirect multipath signal or an interference signal, consider the two element array in FIG. 1. Let antenna elements 10 be omni-directional and let the spacing between them be a half-wave length of the desired signal. The desired signal, P(t), arrives from the normal direction, 0 degrees, and the multipath or interference signal I(t) arrives from 30 degrees displaced from the desired signal. To simplify the calculation, let both P(t) and I(t) have zero phase at the array phase center, PC, which is located midway between the antenna elements. The output signal of each antenna element 10 goes to a variable complex weight 26″, where $W_1+jW_2$ and $W_3+jW_4$ correspond to elements E1 and E2 respectively. The complex weights output signals are summed in adder 30, the output of which is the array output signal.

The signal of interest, in complex notation, is $$P(t)=P_o\exp(jwt),$$

where t is time, $P_o$ is the signal amplitude, and w is the signal angular frequency. The array output signal due to the signal of interest is $$SI(t)=P_o\{(W_1+W_3)+j(W_2+W_4)\}\exp(jwt). \quad (2)$$

The desired array output signal is an unaltered copy of the signal of interest. By equating equations (1) and (2), and collecting the real and imaginary terms, the required weight relationships to get the desired output signal are $$W_1+W_3=1 \quad (3)$$

$$W_2+W_4=0. \quad (4)$$

The unwanted indirect path signal is $$I(t)=I_o\exp(jwt) \quad (5)$$

where $I_o$ is the signal amplitude.

The distance traveled by a received signal is different for each antenna element. I(t), which is incidencing the antenna array from an angle of 30 degrees, will arrive at antenna element E2 with a phase lead, relative to the antenna array phase center, of $$\theta=2\pi(\tfrac{1}{4})\sin(30)=\pi/4 \quad (6)$$

radians and, similarly, it will arrive at antenna element E1 with a phase lag of $\theta=-\pi/4$ radians. Therefore, the array output signal due to I(t) is $$SM(t) = I_o\{[W_1+jW_2]\exp[j(wt-\pi/4)] + [W_3+jW_4]\exp[j(wt+\pi/4)]\}. \quad (7)$$

Since it is desired to reject the unwanted multipath signal, equation (7) must equal zero. By using the relationships $$\exp(-j\pi/4) = (1/\sqrt{2})(1-j) \quad (8)$$

and $$\exp(j\pi/4) = (1/\sqrt{2})(1+j) \quad (9)$$

and collecting the real and imaginary terms, equation (7) gives $$W_1 + W_2 + W_3 - W_4 = 0 \quad (10)$$

and $$-W_1 + W_2 + W_3 + W_4 = 0. \quad (11)$$

The weights must satisfy equations (10) and (11) to reject the multipath signal.

Equations (5), (6), (10), and (11) give 4 equations and 4 unknowns. Solving for the weights gives $$W_1 = 0.5, W_2 = -0.5, W_3 = 0.5, W_4 = 0.5. \quad (12)$$

With these weight values the antenna array will accept the signal of interest, P(t), and reject the unwanted multipath signal, I(t). The array is functioning as a spatial filter.

In an adaptive array the weights are changed automatically to the correct values that reject the unwanted multipath/interference signals and accept the signal of interest. As the signal environment changes, the weights adapt to continue rejecting the multipath/interference. To be an adaptive array, the simple array in FIG. 1 requires a means for automatically changing the weights. There are many approaches for changing the array weights automatically. For the signal environment of interest in this invention, the direction of arrival (DOA) and the time of arrival (TOA) of the signal of interest and the unwanted multipath/interference signal are unknown. The class of adaptive arrays that use a reference signal in their automatic weight adjustment scheme where, ideally, the reference signal is a replica of the signal of interest, is best suited to reject the multipath. There are many methods for using a reference signal to adapt the weights automatically, of which, the Least Means Square Error method (LMS) and the Random Search method and their variations are just a couple of examples. Many examples of adaptive arrays using reference signals in their weight adjustment schemes can be found in: Robert A. Monzingo and Thomas W. Miller, *Introduction to Adaptive Arrays*, John Wiley & Sons, New York, 1980; Bernard Widrow and Samuel D. Stearns, *Adaptive Signal Processing*, Prentice-Hall, 1985; and C. F. N. Cowan and P. M. Grant Eds., *Adaptive Filters*, Prentice-Hall, Inc., 1985.

The LMS adaptive array is simple to implement. It is also the best known and the best understood approach to automatically adjust the weights. The LMS adaptive array is the preferred implementation of this invention; this invention is, however, not restricted to the LMS implementation and includes all other means of automatically adjusting weights using a reference signal.

In the LMS adaptive array the difference between the array output signal and the reference signal is called the error signal, $\epsilon$, and is used as a measure of merit in a least means squares sense to adapt the weights by minimizing $\epsilon^2$. The basic theory and technology for the LMS adaptive array has been presented by Bernard Widrow, Proceedings of the IEEE, Vol. 55, No. 12, December 1967, p. 2143 and by Ralph Compton, Proceedings of the IEEE, Vol. 61, No. 6, June 1973, P. 748. The books cited in the previous paragraph also present much theory about LMS adaptive array.

Figure 2:
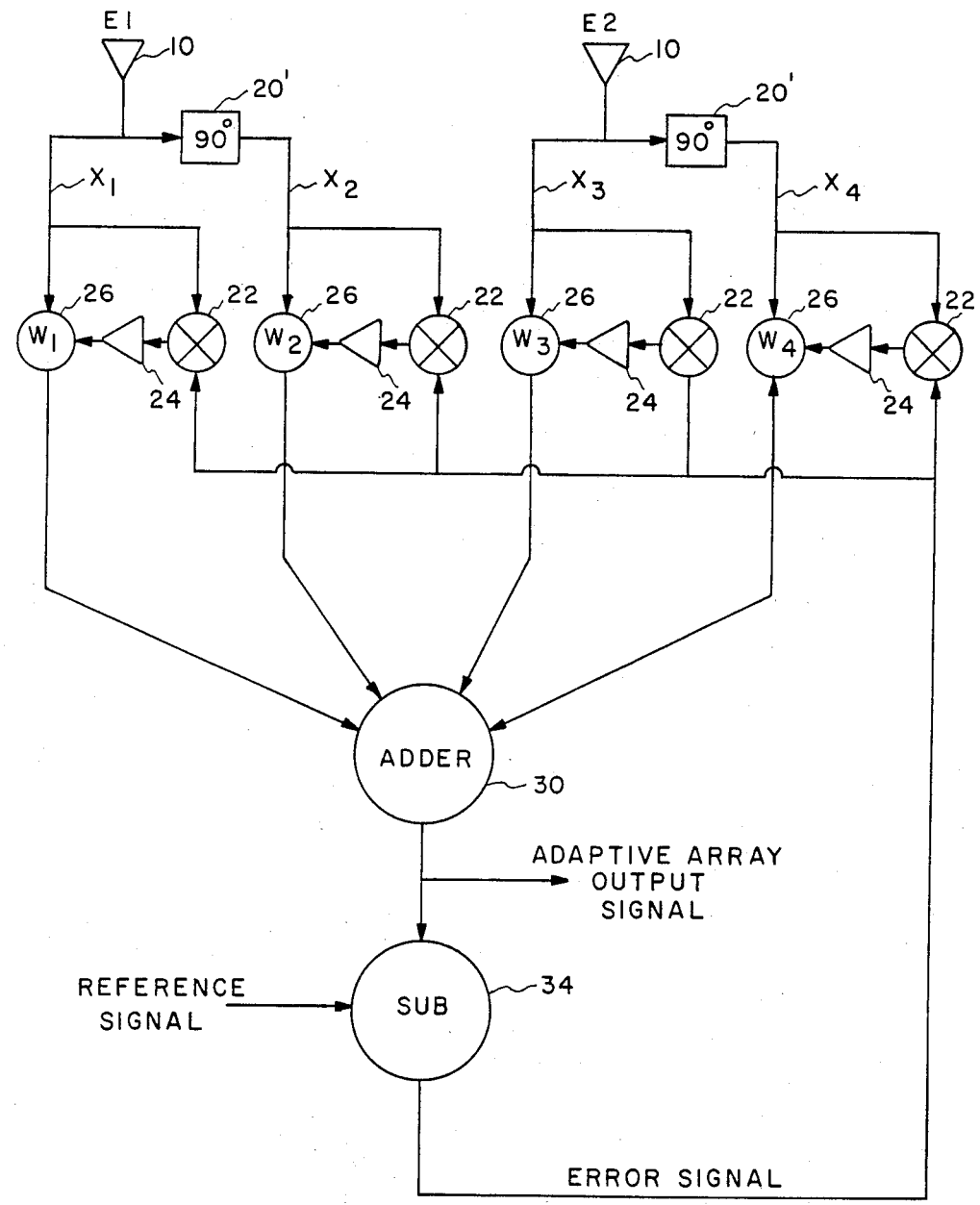
FIG. 2 is a block diagram of a two element adaptive array using an LMS analog implementation: prior art.

FIG. 2 shows a two element adaptive array using an LMS implementation. After the received signals, which include the signal of interest and multipath/interference, enter the antenna elements 10, each element splits the signal into two components; one component is shifted 90 degrees by 20 which can be a phase shifter or a time delay, and the other component's phase is unshifted. Each signal then goes to its respective amplitude weight 26, which are $W_1$, $W_2$, $W_3$, and $W_4$ respectively. Because the signals going to each of the respective antenna element weight pairs are 90 degrees out of phase, they adjust the signal in the element in both amplitude and phase. For element E1, the amplitude weighting is $$A_w = \sqrt{W_1^2 + W_2^2} \quad (13)$$

and the phase shift weighting is $$\phi_w = -\tan^{-1}(W_1/W_2). \quad (14)$$

Element E2 has a similar result for weights $W_3$ and $W_4$. The weighted signals from weights $W_1$, $W_2$, $W_3$, and $W_4$ go to adder 30 where they are summed. The output signal of the adder 30 is the adaptive array output signal and it goes to subtractor 34. The second input signal to subtractor 34 is the reference signal. The array output signal is subtracted from the reference signal by subtractor 34. It is this resulting difference $\epsilon$ between the array output signal and the reference signal that is used in the LMS algorithm to automatically adjust the weights.

The LMS method gives for the value of the "i"th weight $$W_i = WO_i - 2k \int <\epsilon X_i> dt \quad (15a)$$

where $WO_i$ is the value of the "i"th weight at time zero, k is a gain constant, $<\ >$ is the time average, and $X_i$ is the input signal to the "i"th weight. Equations (15a) is the feedback equations for the weights in the analog implementation. The error signal $\epsilon$ and the weight input signals $X_1$, $X_2$, $X_3$, $X_4$ are multiplied by multipliers 22 respectively. The output signals from multipliers 22 go to integrators 24 respectively. The output of the integrators 24 go to the weights 26 respectively and adjusts the weight value. The output signal from each weight goes to adder 30 where they are summed. Each set of multiplier, integrator, weight and input signal together with the error signal, subtractor, and adder constitute an adaptive loop.

The equivalent feedback equation for a discrete/digital implementation of the LMS adaptive array is $$W_i(j+1) = W_i(j) - 2k\,\epsilon(j) X_i(j) \qquad (15b)$$

where the antenna element input signals are discrete time samples with $X_i(j)$ being the "i"th antenna element input signal at the "j"th time sample, $\epsilon(j)$ is the error signal at the "j"th time sample, $W_i(j)$ is the amplitude weight for the "i"th antenna element input signal at the "j"th sample, and $W_i(j+1)$ is the weight value update at "j+1" time sample for the "i"th antenna element input signal.

Figure 3:
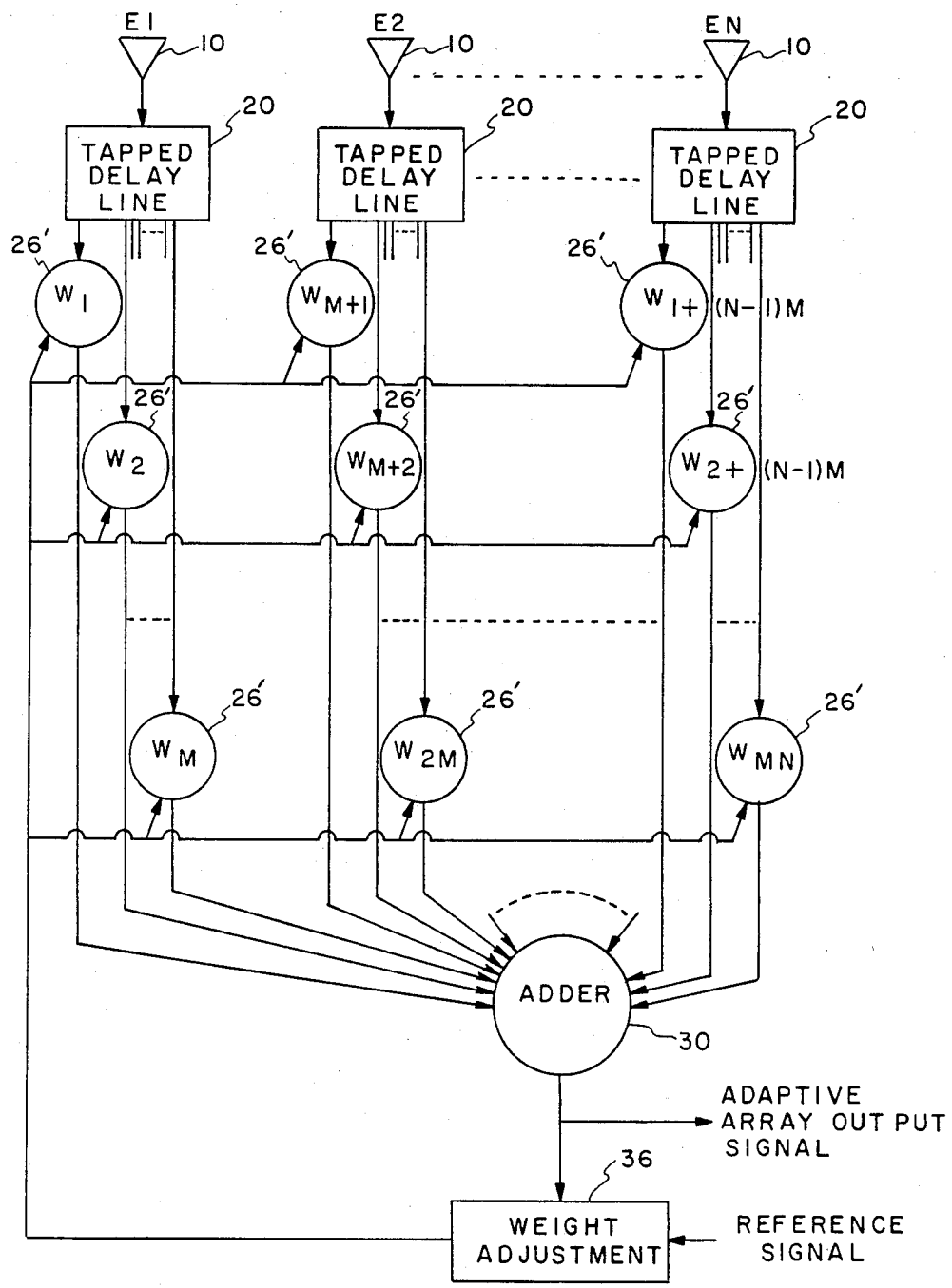
FIG. 3 is a block diagram of an N element adaptive array with tapped delay lines having M output signals respectively: prior art.

The adaptive array is not restricted to two antenna elements and a 90 degree phase delay. It can have many antenna elements and it can have many time(phase) delays in each antenna element. FIG. 3 shows an antenna array with N elements 10. Each element 10 has a tapped delay line 20 with M output terminals, each of which provides an input signal for an adaptive loop. The weight adjustment block 36 and the weights 26' refer to any weight adjustment method, including the LMS, which use a reference signal. An N element array with each element 10 having a tapped delay line 20 with M output signals, has NxM adaptive loops which have their output signals summed by the adder 30. Because there are more adjustable weights (parameters), the additional antenna elements and delay line output signals give the adaptive array more degrees of freedom to handle a greater number of multipath/interference signals and a wider bandwidth.

NATURE OF MULTIPATH

In a multipath environment the transmitted signal arrives at the receiver from several directions simultaneously where there is a direct path and one or more indirect paths. The indirect paths are longer than the direct path, so the signals traveling these paths arrive at the receiver at a later time than the direct path signal. It is this difference in the time of arrival that causes distortion in both the amplitude and the phase of the received signal. For example, consider angle modulation (FM, PM, etc.); the direct path signal, in real notation, is $$X_1(t) = B_1 \sin[w(t - R_1/c) + \alpha f(t - R_1/c)] + n_1(t) \qquad (16)$$

where f(t) is the modulation, $B_1$ is a constant amplitude, $R_1$ is the path length, c is the speed of light, $\alpha$ is the phase deviation, and $n_1(t)$ is a random noise term. The indirect path signal has the form $$X_i(t) = B_i \sin[w(t - R_i/c) + \alpha f(t - R_i/c)] + n_i(t) \qquad (17)$$

where the $X_i(t)$ indicates the "i"th path signal, $B_i$ is a constant signal amplitude for the "i"th path, $R_i$ is the distance traveled by the "i"th path signal, and $n_i(t)$ is a random noise term. The $n_i(t)$ and $n_1(t)$ are all independent. The $X_i(t)$ s are all delayed versions of the direct path signal. The total signal present at a given point in space is the sum of the direct and indirect path signals. Using equations (16) and (17), the total received signal can be written as $$E(t) = X_1(t) + \sum_{i=2}^{N} X_i(t). \qquad (18)$$

In equation (18), for mathematical convenience, the term $X_1(t)$ has subscript one and refers to the direct path signal, the $X_i(t)$ in the summation, where i=2 to i=N, refers to the indirect paths signals or the interference signals (N−1 unwanted signals). Summing over sinusoids, and for convenience assuming that the noise terms are small and can be neglected, equation (18) can be written as $$E(t) = A(t)\sin[wt + a(t)] \qquad (19)$$

where $$A(t) = \left\{ \left[ \sum_{i=1}^{N} B_i \cos(P_i) \right]^2 + \left[ \sum_{i=1}^{N} B_i \sin(P_i) \right]^2 \right\}^{\frac{1}{2}}$$

$$a(t) = \tan^{-1}\left\{ \left[ \sum_{i=1}^{N} B_i \sin(P_i) \right] \bigg/ \left[ \sum_{i=1}^{N} B_i \cos(P_i) \right] \right\}$$

and $$P_i = -(wR_i/c) + \alpha f(t - R_i/c).$$

If equation (19) represents the net signal present at an antenna array phase center, it can be immediately seen that the net signal received is different at each antenna element because the distance traveled, $R_i$, for the direct path signal and the indirect path signals is different for each antenna element.

REFERENCE

The class of adaptive arrays of interest in this invention use a reference signal which, ideally, is a replica of the desired signal to adjust the system weights. The difficult task is obtaining the reference signal. The unique aspect of this invention that makes it different from all the prior art is the way in which the reference signal is generated and its application to removing unwanted multipath and interference signals when the DOA and TOA of the signals are unknown. By generating the required reference signal through the amplitude limiting of the adaptive array output signal, this invention can reduce the negative effects of multipath and interference signals by rejecting the unwanted signals, as will be shown below. In contrast to the prior art, it does this without using special codes, tones, or waveform structures in the transmitted signal of interest. As is shown below, this is possible because of the unique characteristics resulting from the reference signal being obtained by amplitude limiting the adaptive array output signal.

The array output signal is the weighted sum of the antenna elements input signals. Each antenna element will have an input signal similar to equations (18) and (19), being made up of a direct path and indirect path signals. Using FIG. 3, let $$E_n(t) = A_n(t) \sin[wt + a_n(t)] \quad (20)$$

be the equation of the resulting input signal for the sum of all the signals arriving at the "n"th antenna element 10, where $A_n(t)$ is the signal amplitude and $a_n(t)$ is the signal phase. Each antenna element 10 goes to an M output signal delay line 20 which forms M adaptive loops. The equation of the "m"th delay line output signal for the "n"th antenna element is $$E_n(t-d_m) = A_n(t-d_m) \sin[w(t-d_m) + a_n(t-d_m)], \quad (21)$$

where $d_m$ is the time delay of the delay lines "m"th output signal. Since there are N antenna elements 10 and M output signals for each tapped delay line 20, there is a total of NxM weights 26'. The adder 30 sums the weighted tapped delay line 20 output signals. The output signal of adder 30 is the array output signal and is given by $$S_{ar}(t) = \sum_{\substack{n=1 \\ m=1}}^{N,M} W_{nm} A_n(t-d_m) \sin[w(t-d_m) + a_n(t-d_m)]. \quad (22)$$

where the nm subscript of $W_{nm}$ refers to the weight 26' of the "m"th delay line 20 output signal of the "n"th antenna element 10. Summing over sinusoids, equation (22) can be written as $$S_{ar}(t) = G(t) \sin[wt + q(t)] \quad (23)$$

where $$G(t) = \left\{ \left[ \sum_{\substack{n=1, \\ m=1}}^{N,M} W_{nm} A_n(t-d_m) \cos(z_{nm}) \right]^2 + \left[ \sum_{\substack{n=1 \\ m=1}}^{N,M} W_{nm} A_n(t-d_m) \sin(z_{nm}) \right]^2 \right\}^{\frac{1}{2}}$$

$$q(t) = \tan^{-1} \left\{ \left[ \sum_{\substack{n=1 \\ m=1}}^{N,M} W_{nm} A_n(t-d_m) \sin(z_{nm}) \right] \bigg/ \left[ \sum_{\substack{n=1 \\ m=1}}^{N,M} W_{nm} A_n(t-d_m) \cos(z_{nm}) \right] \right\}$$

and $$z_{nm} = -d_m + a_n(t-d_m).$$

Figure 4:
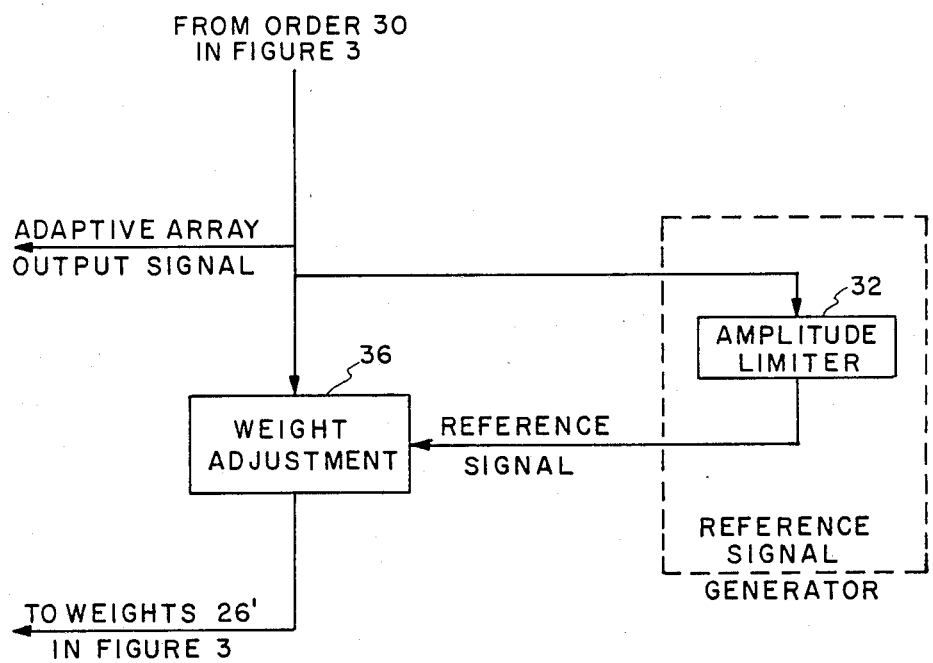
FIG. 4 is a block diagram showing the reference signal generator.

FIG. 4 shows the reference signal generated from the array output signal of the adaptive array in FIG. 3. The array output signal represented by equation (23) goes to the amplitude limiter 32 to generate the reference signal which is represented mathematically as $$R(t) = F \sin[wt + q(t)] \quad (24)$$

where F is a constant signal amplitude determined by the limiter. The amplitude limiter 32 keeps its output signal amplitude at a constant value even when the amplitude of the input signal changes. The amplitude limiter 32 output signal goes to the weight adjustment 36 where it is used to compute weight values.

Figure 5:
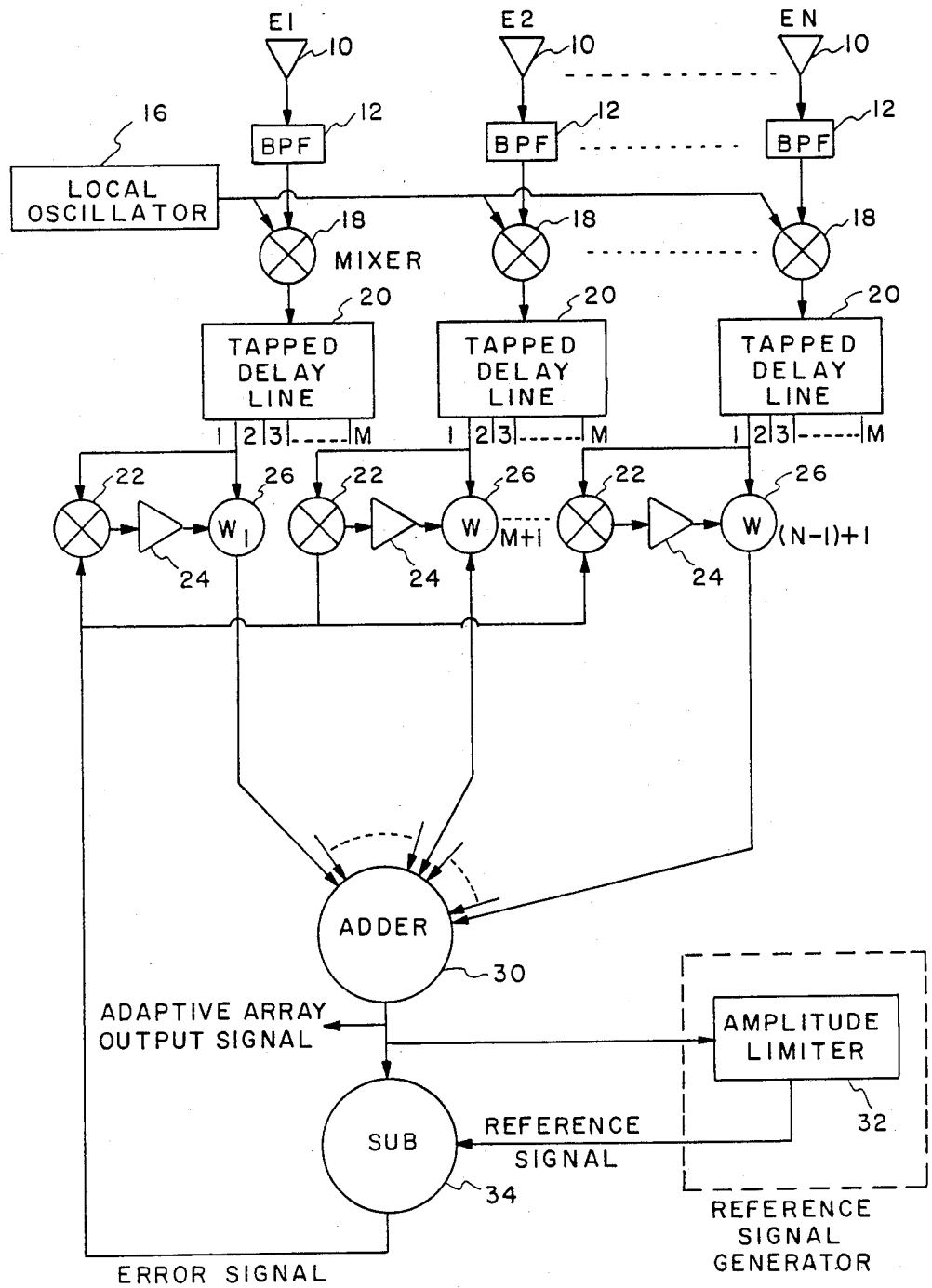
FIG. 5 is a block diagram of the invention in an LMS configuration which contains N antenna elements each having a tapped delay line with M output signals.

In FIG. 5, the LMS adaptive array implementation is used to compute the weight values. The amplitude limiter 32 output signal, which is the reference signal, goes to the subtractor 34 which subtracts the adaptive array output signal from it. The resulting error signal goes to the adaptive loop multipliers 22. The multipliers 22 output signals are each integrated by integrators 24 respectively, the output signals of which adjust the values of the respective weights 26. As described in the references given above, the adaptive array will adjust the weights to make the array output signal match the reference signal in amplitude and phase by minimizing the means square of the difference between the reference signal and the array output signal. It does this by correlating the signal of interest with the reference signal, as described below, and tries to null out the unwanted signals.

Each antenna element signal, as expressed by equation (20), is made up of the sum of the received input signals, and consequently, the received input signal which is most significant is the one with the largest amplitude. Since each antenna element signal, and therefore each weighted antenna element signal, contain time shifted versions of the same received input signals, they all are dominated by the same signal. The array output signal as expressed by equation (22) is the sum of the weighted antenna element signals, and therefore, it is also most influenced by the largest received input signal. And, consequently, both the amplitude G(t) and phase q(t) of equation (23) are also most influenced by the largest input signal. And the reference signal represented by equation (24) is also most influenced by the largest received input signal via q(t).

The adaptive array tries to receive the input signal which is most correlated with the reference signal and reject the other input signals. Since the reference signal is most influenced by the largest input signal, it is most correlated to the largest input signal. So the adaptive array uses the largest input signal as the signal of interest while rejecting the other input signals by placing antenna pattern nulls in their DOA.

A direct path signal between a communications transmitter and receiver may not always exist due to buildings, hills, etc. blocking the path. In that event this invention will take the received signal with the largest amplitude as the signal of interest because it uses the largest signal received as the signal of interest. It will null out all the other multipath/interference signals just as in the direct path signal environment case.

Figure 6:
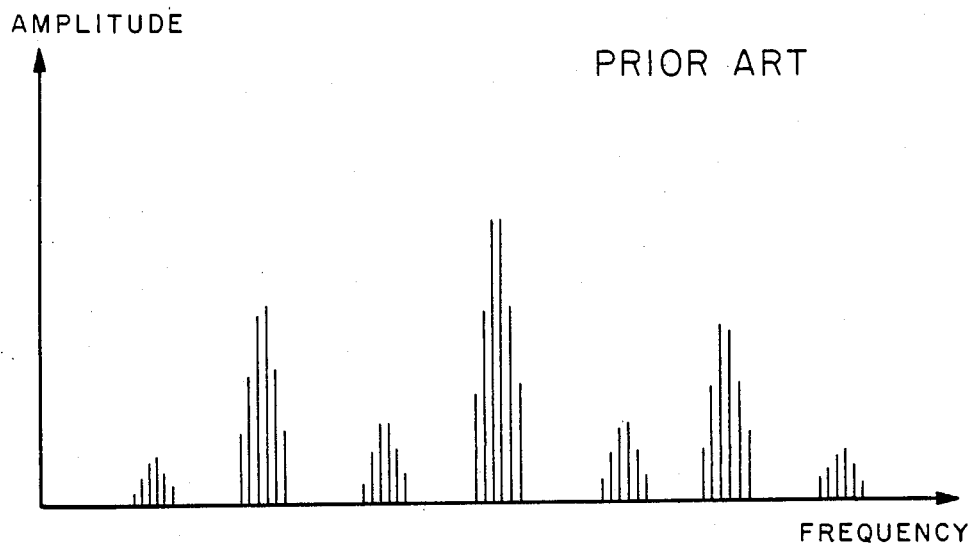
FIG. 6 is a graph of an example spectrum of the adaptive array output signal: prior art.
Figure 7:
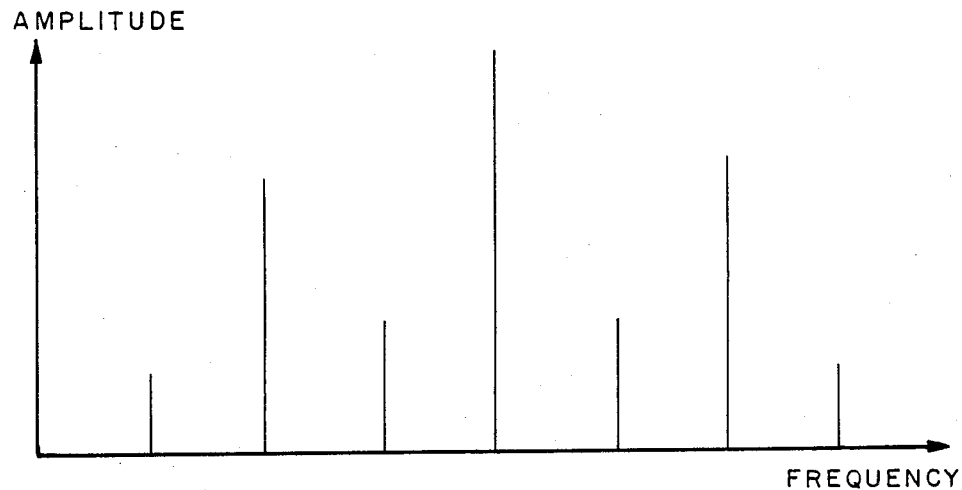
FIG. 7 is a graph of the reference signal spectrum derived from the adaptive array output signal in FIG. 6.

More insight into the reference signal can be gained by comparing its spectrum to that of the array output signal. In the array output signal equation (23), the sinusoid factor can be expanded into its spectral components (Fourier expansion) and has the form $$G(t)\sin[wt + q(t)] = G(t) \sum_{n=1}^{\infty} B_n \cos(nwt + \gamma_n). \quad (25)$$

where $B_n$ and $\gamma_n$ are the Fourier coefficient and phase respectively. The amplitude factor G(t) multiplies each spectral component which it essentially modulates and splits. A simple example of a possible adaptive array output signal spectrum is shown in FIG. 6. By amplitude limiting equation (23) to generate the reference signal as represented by equation (24), G(t) is removed and replaced by the constant amplitude F. This changes the signal amplitude and removes the spectral splitting which makes the reference signal spectrum different from that of the adaptive array output signal spectrum. FIG. 7 shows the spectrum of the reference signal obtained from the array output signal. The adaptive array changes the weights in such a way that the amplitudes and spectra of the reference signal and the adaptive array output signal are the same. It does this by placing antenna pattern nulls in the DOA of the unwanted signals. This in turn removes the distortions caused by the unwanted signals. When the adaptive array has fully adapted, the array output signal is the same as the signal of interest.

As given in the references cited above for the traditional LMS adaptive array theory, the error signal $\epsilon$, which is the difference between the reference signal and the array output signal, is used to adjust the weight values. Let R(t) be a reference signal that is a replica of the desired signal and $X_i(t)$ be the input signal to "i"th weight $W_i$. The error signal is represented by $$\epsilon = R(t) - \sum_{i=1}^{N} W_i X_i(t). \quad (26)$$

Squaring the error in equation (26) and then performing a time average gives the mean square error, $$<\epsilon^2> = <R(t)^2> - 2\sum_{i=1}^{N} W_i <X_i(t)R(t)> + \sum_{\substack{i=1 \\ k=1}}^{N,N} W_i W_k <X_i(t)X_k(t)> \quad (27)$$

where $<\ >$ is the time average. Equation (27) is quadratic in the weights $W_i$ in an "N" dimensional space (N' antenna elements times M delay line output signals). Consequently, it has a single extremum which is a minimum. At this minimum the error between the reference signal and the array output signal is a minimum (in the mean least squares sense). The minimum occurs when antenna pattern nulls are placed in the DOA of the unwanted signals. Applying the method of steepest decent to equation (27) to obtain the minimum yields the feedback equation already presented in equation (15a).

To derive the traditional reference LMS adaptive array feedback equation for an unmodulated carrier, let the "i"th weight input signal be $$X_i = A_i \sin(wt + \theta_i) \quad (28)$$

where $A_i$ and $\theta_i$ are constants. The reference signal provided to the adaptive array is the sine wave $$R(t) = F \sin(wt + \delta) \quad (29)$$

where F is a constant chosen to have the same value as the amplitude of the reference signal generated in this invention (as represented in equation (24)). And $\delta$ is an arbitrary constant. The error signal is $$\epsilon = F \sin(wt + \delta]) - S_{ar}. \quad (30)$$

Using equation (15a), the feedback equation for the "i"th weight of the traditional reference LMS adaptive array is $$W'_i = WO_i + 2k \int \{<F\sin(wt+\delta)X_i> - <S_{ar}X_i>\}dt. \quad (31)$$

Using equation (28) and the relationships $$<\cos^2(wt)> = <\sin^2(wt)> = \tfrac{1}{2} \quad (32)$$

and $$<\sin(wt)\cos(wt)> = 0 \quad (33)$$

gives $$W'_i = WO_i + 2k \int \{FA_i <\cos(\delta - \theta_i)> - <S_{ar}X_i>\}dt. \quad (34)$$

It is shown below that this invention in an LMS implementation reduces to the traditional reference LMS adaptive array and equation (34) at equilibrium.

In this invention the reference signal is obtained by amplitude limiting the array output signal. In this case the error signal becomes, using equations (23) and (24), $$\epsilon = F \sin[wt + q(t)] - S_{ar} \quad (35)$$

where $S_{ar}$ is the array output signal. Substituting equation (35) into equation (15a), the feedback equation for each weight is $$W_i = WO_i - 2k \int <F \sin[wt+q(t)]X_i - S_{ar}X_i>dt \quad (36)$$

where $X_i$ is the antenna element input signal for the "i"th weight. Substituting equation (28) into equation (36) and using equations (32) and (33) gives $$W_i = WO_i - 2k \int \{A_i F <\cos[q(t) - \theta_i]> - <S_{ar}X_i>\}dt. \quad (37)$$

The difference between equation (37) and the weight value for the traditional reference LMS adaptive array in equation (34) is the phase of the first term under the integral, $$\Delta = q(t) - \delta. \tag{38}$$

The traditional reference LMS adaptive array aligns the array output signal phase with the reference signal phase $\delta$. The actual value of the reference signal phase constant in terms of the array performance is arbitrary. But in equation (37), the corresponding feedback equation for this invention, the value of q(t) depends on the weight values. As the weights change, q(t) changes. But, experimentally, this invention goes to an equilibrium condition where the weights are constant. This means q(t) is constant. Since the phase constant $\delta$ of the traditional reference LMS adaptive array is an arbitrary constant, equation (34) is functionally the same as equation (37) when q(t) is constant. This implies that this invention operates in a manner similar to the traditional reference LMS adaptive array and that the traditional reference LMS adaptive array results can be used to predict the behavior of this invention. More specifically, since the traditional reference LMS adaptive array rejects unwanted multipath signals by placing an antenna pattern null in their DOA, this invention rejects unwanted multipath signals by placing an antenna pattern null in their DOA.

As a further example, consider a multipath environment for a signal of interest that is angle modulated (FM, PM, etc.). The external reference signal for the traditional LMS adaptive array has the form $$R_o(t) = F \sin[wt + \phi_o + \alpha f(t)] \tag{39}$$

where F, $\phi_o$, and $\alpha$ are constants, and f(t) is the modulation. The input signal to the "nm"th weight is given by equation (21). The array output signal is given by equations (22) and (23). Substituting equations (21) and (39) into equation (15a) and using the relationships in equations (32) and (33) gives as the feedback equation for the "nm"th weight for the traditional LMS adaptive array $$W_{nm} = WO_{nm} - 2k \int \{F < A_n(t) \cos[\phi_o + \alpha f(t) - a_n(t)] > - < S_{ar} X_{nm} > \} dt. \tag{40}$$

The reference signal for this invention is given by equation (24). Using equations (15a), (21), (24), (32), and (33) gives as the "nm"th weight feedback equation for this invention $$W_{nm} = WO_{nm} - 2k \int \{F < A_n(t) \cos[q(t) - a_n(t)] > - < S_{ar} X_{nm} > \} dt. \tag{41}$$

For a signal with a narrow enough bandwidth, $A_n(t) \approx A_o$, $a_n(t) \approx \alpha f(t) + \phi_o$ and $q(t) \approx \alpha f(t) + \gamma'$ where $\phi_o$ and $A_o$ are constants and $\gamma' = \gamma'(W_{11}, \ldots W_{nm})$. Then equation (40) becomes for narrowband signals $$W_{nm} \approx WO_{nm} - 2k \int \{A_o F < \cos[\phi_o - \phi_o] < - < S_{ar} X_{nm} > \} dt \tag{42}$$

and equation (41) becomes $$W_{nm} \approx WO_{nm} - 2k \int \{FA_o < \cos [\gamma' - \phi_o] > - < S_{ar} X_{nm} > \} dt. \tag{43}$$

At equilibrium $\gamma'(W_{11}, \ldots W_{nm})$ is a constant, and consequently, equation (43), the feedback equation for this invention in an LMS implementation, is functionally the same as equation (42), the feedback equation for the traditional LMS adaptive array. This is the same as the case presented above for the unmodulated carrier.

It can be seen for the wider bandwidth angle modulated signals that placing an antenna pattern null in the direction of arrival of the unwanted multipath signals causes the feedback equations of this invention to approach the traditional LMS adaptive array feedback equations. The array output signal for this invention after adaption is $$S_{ar} \approx B_o \sin (wt - \alpha f(t) + \delta_o) \tag{44}$$

where $B_o$, and $\delta_o$ are constants. The reference signal becomes $$R(t) = F \sin(wt - \alpha f(t) + \delta_o) \tag{45}$$

Subsituting equations (44) and (21) into equation (15a) gives $$W_{nm} = WO_{nm} - 2k \int \{F < A_n(t) \cos[\delta_o + \alpha f(t) - a_n(t)] > - < S_{ar} X_{nm} > \} dt. \tag{46}$$

Comparing equation (46) to equation (40) shows that they are functionally the same.

The traditional LMS adaptive array is a good model for performance of this invention in an LMS implementation for angle modulated signals and the unmodulated carrier in a multipath environment. This relationship between the traditional LMS adaptive array and the LMS implementation of the present invention can be extended to other modulation types, such as AM, with a similar approach.

Figure 9:
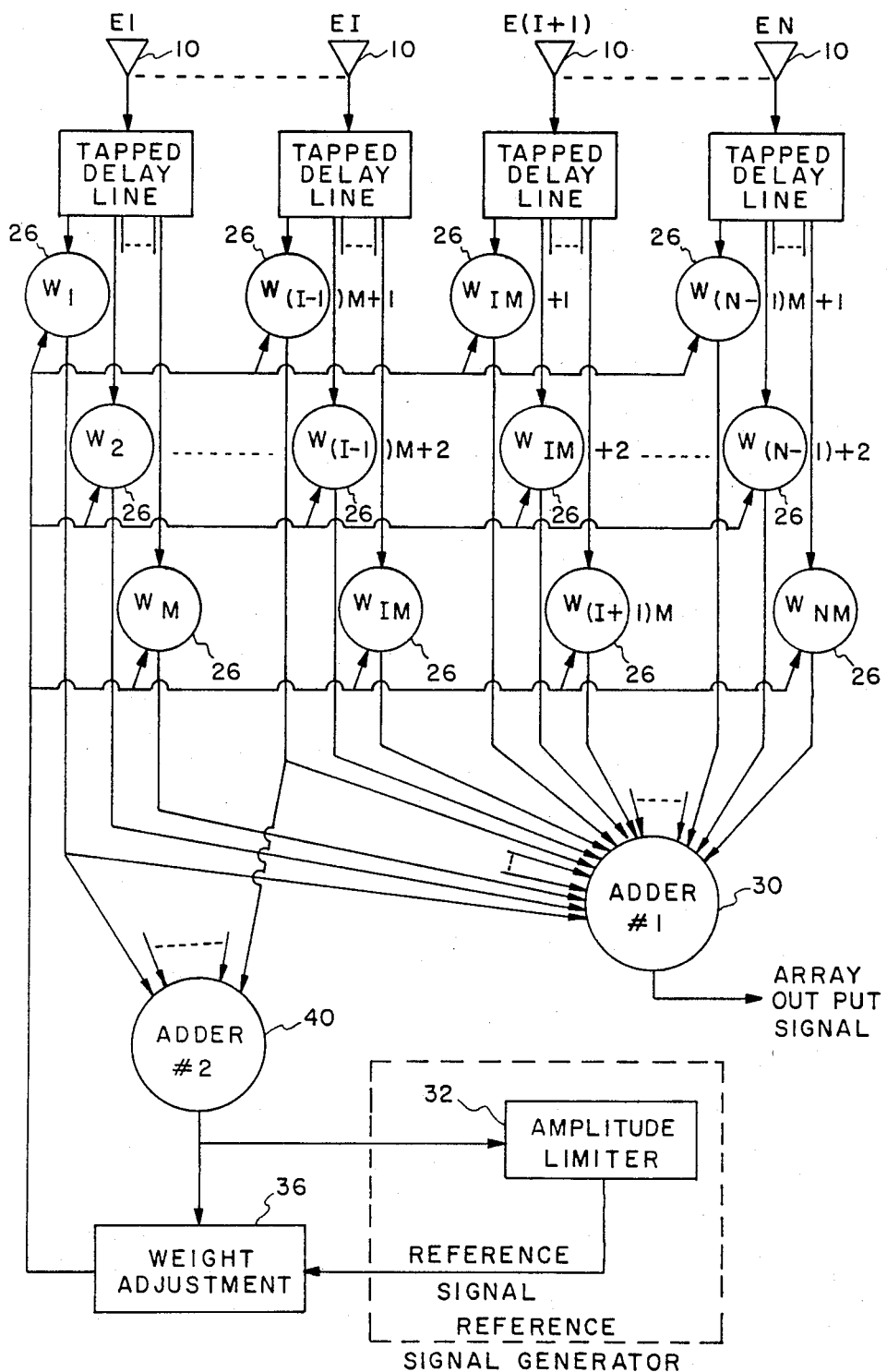
FIG. 9 is a block diagram of the invention where a subset of the weighted signals are summed for the generation of the reference signal.

FIG. 9 shows another implementation of the invention. By comparing FIG. 9 to FIGS. 3 and 4 it can be seen that the first adder 30 in FIG. 9 corresponds to adder 30 in FIGS. 3 and 4. But in FIG. 9 selected weight signals are also applied to the second adder 40. The adaptive array output signal is obtained, as in FIGS. 3 and 4, from the first adder 30. However, the input signal to the amplitude limiter 32 in FIG. 9 is obtained from second adder 40. The output signal from the the second adder 40 also is applied to weight adjustment 36. So in FIG. 9 the input signal to the weight adjustment means and the amplitude limiter is obtained from the sum of a subset of the weight signals. The weight adjustment is applied to all the amplitude weights in the array just as in FIGS. 3 and 4.

The phase of the reference signal can be an important factor for system stability. In a hardware analog implementation, the limiter can shift the reference phase excessively when the array output level changes too much. The greater the phase shift of the limiter due to the change of the amplitude of the array output signal, the smaller the dynamic range the adaptive array system can have. Ideally, to maximize the system dynamic range, the limiter should show no phase shift with a change in the array output signal level. The Avantek, Inc. UTL-1002 is a good example of a limiter that has a small phase shift with a change in the input signal amplitude.

The ideal reference signal generator will have a phase shift that is zero or an integral multiple of the desired signal wave length. Then the reference signal phase will be the same as the array output signal.

Figure 8:
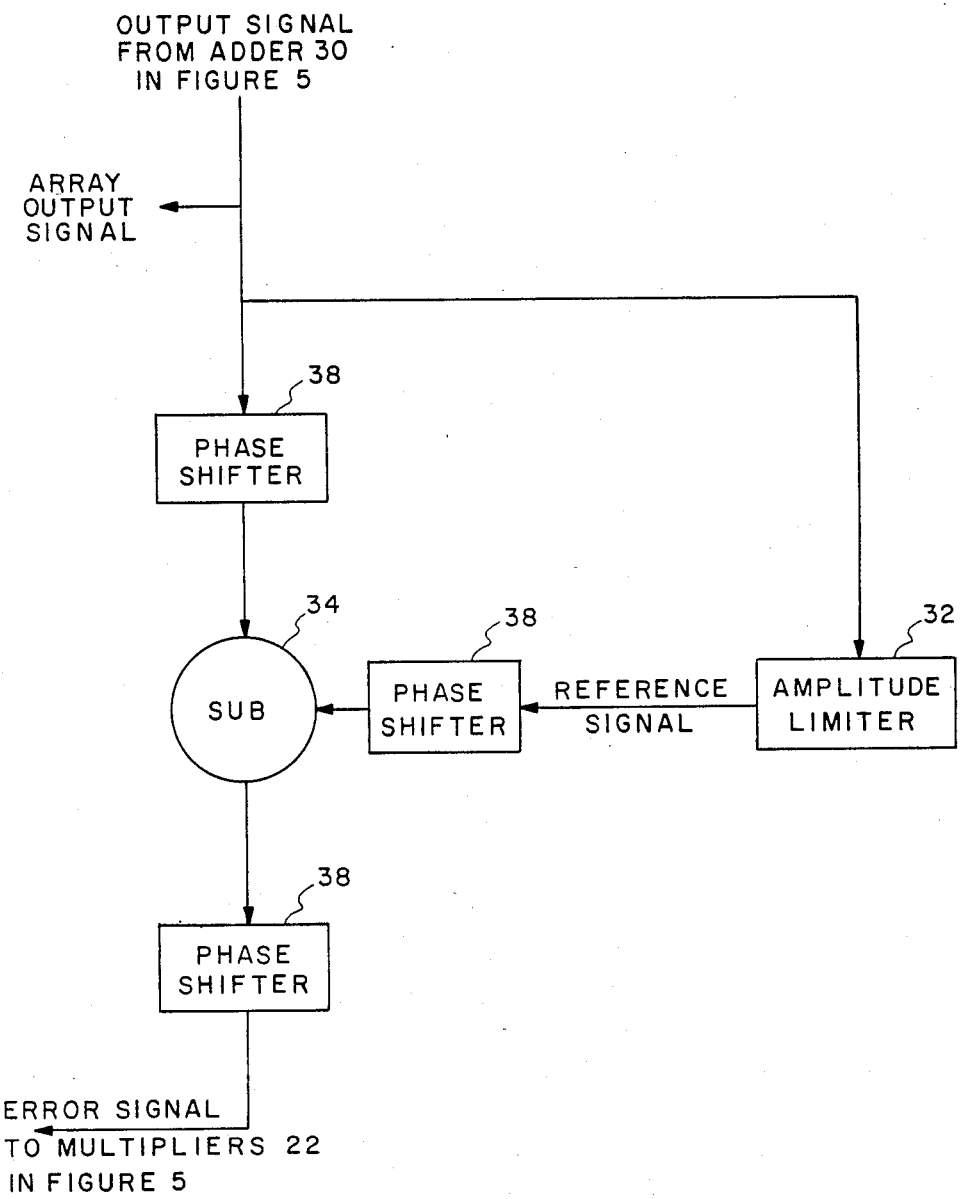
FIG. 8 is a block diagram showing phase shifters.

It is also convenient in an analog hardware implementation to have a phase shift device 38 in the reference generator signal loop, the error signal path and the subtractor branch of the adaptive array output signal respectively. FIG. 8 shows the phase shift devices 38 for the adaptive array in FIG. 5. The adaptive array output signal comes from adder 30 and goes to the first phase shift device 38 and amplitude limiter 32. The output signal from the first phase shift device 38 goes to subtractor 34. The output signal from amplitude limiter 32 goes to the second phase shift device 38. The output signal from the second phase shift device 38 is the second input signal to subtractor 34. The output signal from subtractor 34, which is the error signal, goes to a third phase shift device 38. The third phase shift device 38 output signal goes the the multipliers 22. This permits optimal alignment of the system phase constants to maximize performance.

OTHER INTERFERENCE

The adaptive array is also able to reduce distortion effects caused by interference sources other than multipath signals. As described above, the dominate term in the array output signal is the term with the largest amplitude, which, in turn, corresponds to the array input signal with the largest amplitude. Consequently, the reference signal generated by amplitude limiting the array output signal is dominated by this term also. Since the adaptive array correlates the reference signal to the array input signals, and since the dominate term of the reference signal corresponds to the dominate array input signal, the adaptive array receives the dominate array input signal and rejects the signals with a lower amplitude level. Therefore, when the amplitude of the signal of interest is greater than the amplitude of the interference signals, the interference signals are rejected.

DESCRIPTION

Having presented the principles of operation of the adaptive array, a detailed description using the reference generator is presented below. The signal of interest contains no special codes, transmitted tones, or special waveform structures to achieve the rejection of the indirect path signals as has been the case in the prior art. The DOA and the TOA of the signals are also unknown.

FIG. 5 shows an LMS adaptive array with the reference signal generator of the present invention. The LMS implementation of the adaptive array is the preferred implementation, however, the invention may be implemented by any other means of adjusting the weights that use a reference signal. The input signals to the adaptive array are developed by appropriate input devices such as antenna elements 10, bandpass filters 12, and mixers 18. The second input signal to the mixers 18 is generated by a single local oscillator 16, thus, mixers 18 convert the input signals to phase coherent signals at an appropriate IF frequency. The respective mixer output signals go to a corresponding tapped delay line 20 which has M output terminals. Each tapped delay line 20 output signal goes to a corresponding amplitude weight 26 and multiplier 22. The multiplier 22 associated with each tapped delay line 20 output signal receives the error signal from subtractor 34 as its second input signal. Each multiplier 22 output signal goes to a corresponding integrator 24. The integrator 24 output signal goes to a corresponding amplitude weight 26. The amplitude weight 26 weights its input signal from the corresponding tapped delay line 20 output signal. The amplitude weight 26 output signals go to adder 30 where they are summed. The adder 30 output signal is the adaptive array output signal which goes to the appropriate next stage of signal processing, such as an IF amplifier, a demodulator, etc.

The adder 30 output signal also goes to the amplitude limiter 32 and the subtractor 34. The amplitude limiter means 32, which keeps its output signal amplitude at a constant level no matter what the amplitude of its input signal, generates the reference signal; the frequency and phase of the amplitude limiter input signal are preserved in the output signal. The amplitude limiter 32 output signal, which is its reference signal, goes to the subtractor 34. Subtractor 34 subtracts the array output signal of adder 30 from the reference signal of amplitude limiter 32 to yield an error signal. The error signal from subtractor 34 is then applied to each multiplier 22 as described above. The system adjusts the amplitude weights so that the unwanted multipath and/or interference signals are rejected resulting in less distortion of the signal of interest at the adaptive array output signal. The invention works for unmodulated, angle modulated, amplitude modulated, etc. signals.

Presented below are manufacturer part/model numbers for the key components of a specific hardware implementation of FIG. 5 and FIG. 8. This implementation operates at the intermediate frequency of 10 Mhz after down converting from the received frequency with mixers 18 and local oscillator 16. The tapped delay lines 20 can be implemented with a Data Delay Devices 1505-100A tapped delay line. It has equal taps which, when including an undelayed version of the antenna element input signal, gives the tapped delay line 20 six output terminals, where each output terminal must be properly impedance matched to the system. For narrow bandwidth signals, an alternative to the tapped delay line is the ninty degree hybrid which can be implemented by the Mini-Circuits PSCQ-2-10.5. The multiplier 22 can be implemented with Mini-Circuits SBL-1 mixer operated in the linear multiplication region. The integrator 24 can be implemented with National Semiconductor LH0032 operational amplifier in an integrator circuit. The amplitude weight 26 can be implemented with the Motorola MC1595 four quadrant linear multiplier with proper output impedance matching. The adder 30 can be implemented from a network of Mini-Circuits MSC-2-1 two way power combiners where the number of signals to be summed determines the number of power combiners required. The amplitude limiter 32 can be implemented by an Avantek, Inc. UTL-1002 signal limiter. The subtractor 34 can be implemented by a Mini-Circuits PSCJ-2-1 180 degree two way power combiner. The phase shifter 38 can be implemented by a Data Delay Device 1503-100A variable delay, the output port of which is properly impedance matched. This is one specific hardware implementation of the invention, however, the invention is not limited to the use of these components or this specific implementation.

Figure 10:
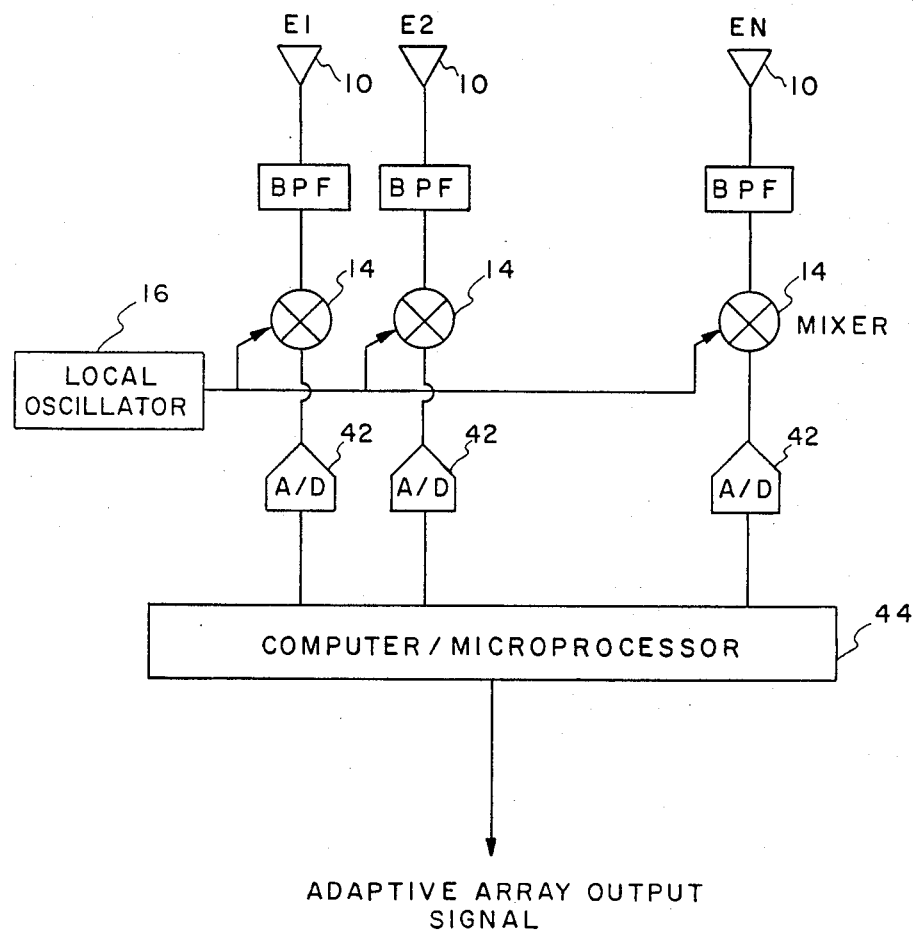
FIG. 10 is a block diagram of a computer implementation of the invention.

This invention can also be implemented in software. FIG. 10 shows the adaptive array which uses a computer or microprocessor. The signal of interest and the unwanted multipath and/or interference signals are received by the antenna elements 10. The composite received antenna element signal is applied to bandpass filter 12. The bandpass filter 12 output signal is applied to mixer 14. The mixer 14 also receives a second input signal which is the output signal of the local oscillator 16. The mixer 14 output signal is applied to the analog to digital (A/D) converter 42. The output signal from the A/D converter 42 is applied to the computer/microprocessor 44. In the computer/microprocessor 44 the adaptive array algorithm is implemented.

Figure 11:
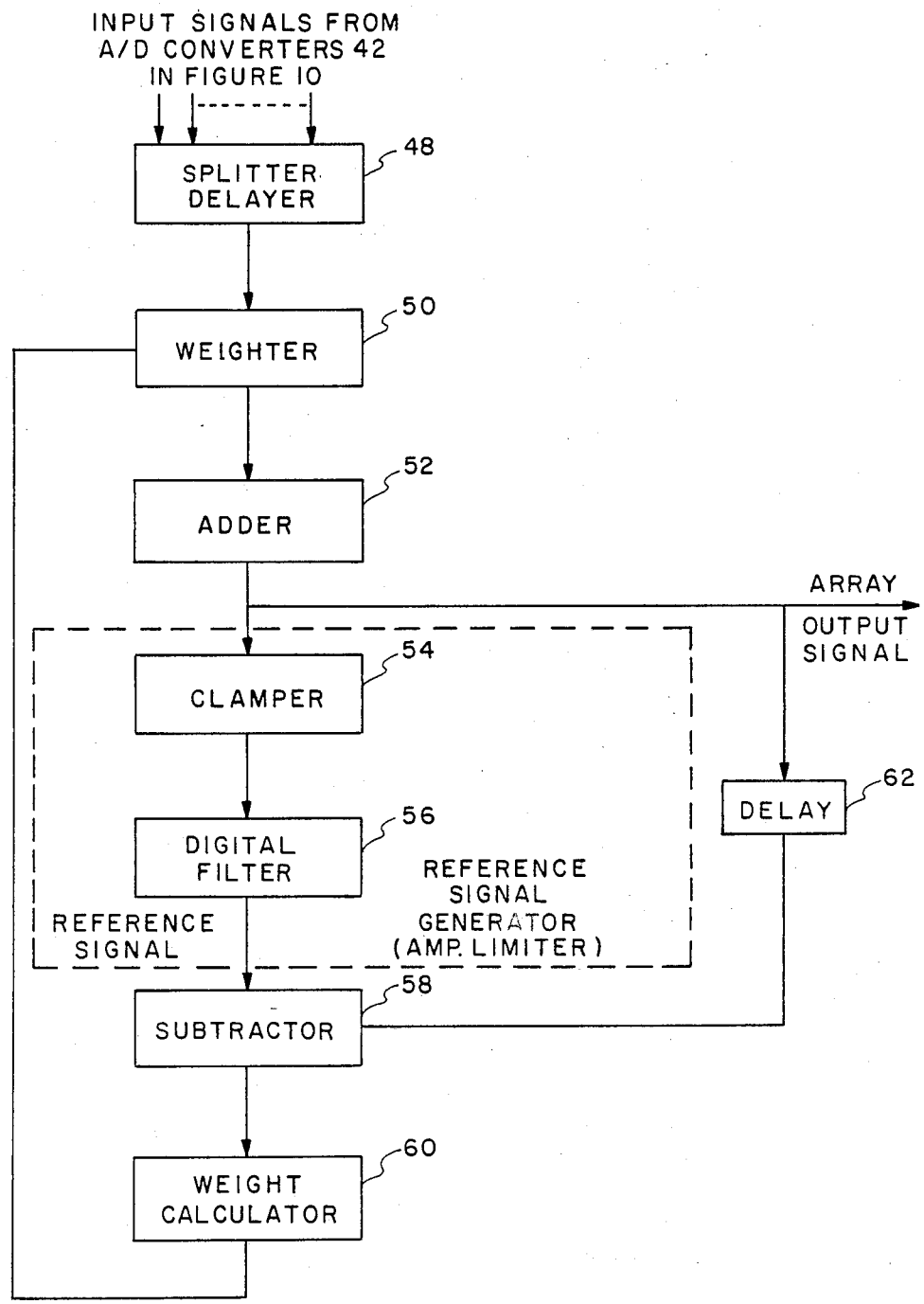
FIG. 11 is the flowchart of a software LMS adaptive array implementation of the invention.

FIG. 11 shows a flow chart of the algorithm for an LMS adaptive array software implementation, however, the software implementation of this invention is not limited to an LMS adaptive array algorithm and includes all adaptive array algorithms that use a reference signal. Each of the antenna element signals from the A/D converters 42 is applied to splitter/delayer 48. The splitter/delayer makes copies of each input signal and delays each copy an appropriate length of time in such a way that it is the software equivalent of the M output tapped delay line; the number of copies of each input signal and the magnitude of each time delay depends on the signal frequencies, signal bandwidth, signal environment, performance required, etc. The splitter/delayer 48 output signal is applied to the weighter 50 where each of the input antenna element signals, delayed and undelayed, are weighted by an initial weight value by weighter 50. The weighted signals from weighter 50 are summed in adder 52. The adder 52 output signal is the adaptive array output signal and is applied to clamper 54, which determines the adaptive array output signal's sign and gives it an amplitude of $+F$ if it is positive and $-F$ if it is negative at each data sample. The constant F is set at a convenient value determined by the amplitude of the received signals, parameter values of other software functional blocks, round off errors, required performance, etc. The clamper 54 output signal is of a rectangular wave form. The clamper output signal 54 is applied to digital filter 56 which removes the 2nd and higher harmonics to convert the rectangular wave form from clamper 54 to a sinusoid form of constant amplitude. The resulting output signal from the digital filter 56 is an amplitude limited version of the adaptive array output signal and is the desired reference signal. The reference signal and a delayed version of the adaptive array output signal from delay 62 are applied to subtractor 58. Delay 62 adjusts the data sample lag that can be introduced by the clamper 54 and the digital filter 56. The appropriately adjusted delay 62 output signal is subtracted from the reference signal by subtractor 58 to form the error signal. The error signal is applied to the weight calculator 60, which calculates the value of each weight using the set of equations (15b). The computed weight values from weight calculator 60 are applied to weighter 50 to update the weight values. The weighter 50 weights the new value of each of the antenna element/splitter/delayer input signals with the new weight values. The cycle continues to repeat itself with the weight values converging to their equilibrium values.

It would be clear to a person skilled in the art that the amplitude limiter implemented by clamper 54 and digital filter 56 can be implemented by other means.

It would be clear to a person skilled in the art that the adaptive array software implemented by the LMS adaptive array software flowchart in FIG. 11 can be implemented by other means.

It would be clear for someone skilled in the art that the invention can be implemented in a digital form or an analog/digital hybrid form.

It would be clear for someone skilled in the art that the invention can be implemented with any of the adaptive array automatic weight adjustment techniques that use a reference signal.

It would be clear for someone skilled in the art that the invention can be implemented with any time domain or frequency domain adaptive array which uses a reference signal to automatically adjust the adaptive array weights.

It would be clear for someone skilled in the art that the invention can be implemented with a cascade or lattice structure.

From the forgoing description, it will be apparent that the invention disclosed herein provides a novel and advantageous signal processing system. It will be understood by those familiar with the art, the invention may be embodied in other specific forms without departing from the spirit or essential characteristics thereof.

What is claimed is:

1. A signal processing system for reducing distortion effects in communication receivers due to multipath, said system comprising:
    adaptive array means having:
    at least two antenna elements;
    weighting means coupled to the antenna elements for selectively weighting the received signals by a selected weight factor; and
    first summing means for adding together the signals from the weighting means for generating an adaptive array output signal; and
    amplitude limiter means having as an input signal said adaptive array output signal for generating a reference signal;
    said adaptive array means also including a means coupled to receive the reference signal and the adaptive array output signal for generating weight values to be applied to the weighting means to automatically redefine the weight factors.

2. A system as in claim 1 further includes a phase adjustment means for adjusting the phase of the reference signal.

3. A system as in claim 1 wherein said means for generating the weight values includes a phase adjustment means for adjusting the phase of the adaptive array output signal.

4. A system as in claim 2 wherein said means for generating the weight values includes a phase adjustment means for adjusting the phase of the adaptive array output signal.

5. A system as in claim 1 further includes a second summing means for adding together the signals from the weighting means for generating the reference signal.

6. A signal processing system for reducing distortion effects in communication receivers due to
LMS adaptive array means having:
at least two antenna elements;
weighting means coupled to the antenna elements for selectively weighting the received signals by a selected weight factor; and
first summing means for adding together the signals from the weighting means for generating an adaptive array output signal; and
amplitude limiter means having as an input signal said adaptive array output signal for generating a reference signal;
said LMS adaptive array means also including a subtractor means coupled to receive the reference signal and the adaptive array output signal for generating an error signal to be applied to the weighting means to automatically redefine the weight factors.

7. A system as in claim 6 further includes a phase adjustment means for adjusting the phase of the reference signal.

8. A system as in claim 6 further includes a phase adjustment means for adjusting the phase of the error signal.

9. A system as in claim 7 wherein said subtractor means includes a phase adjustment means for adjusting the phase of the error signal 10. A system as in claim 6 wherein said subtractor means includes a phase adjustment means for adjusting the phase of the adaptive array output signal.

11. A system as in claim 7 wherein said subtractor means includes a phase adjustment means for adjusting the phase of the adaptive array output signal.

12. A system as in claim 8 wherein said subtractor means includes a phase adjustment means for adjusting the phase of the adaptive array output signal.

13. A system as in claim 9 wherein said subtractor means includes a phase adjustment means for adjusting the phase of the adaptive array output signal.

14. A system as in claim 6 further includes a second summing means for adding together the signals from selected weighting means for generating the reference signal.

15. A signal processing system for reducing distortion effects in communication receivers due to an interference signal with a signal amplitude less than the signal amplitude of the signal of interest, said system comprising:
adaptive array means having:
at least two antenna elements;
weighting means coupled to the antenna elements for selectively weighting the received signals by a selected weight factor; and
first summing means for adding together the signals from the weighting means for generating an adaptive array output signal; and
amplitude limiter means having as an input signal said adaptive array output signal for generating a reference signal;
said adaptive array means also including a means coupled to receive the reference signal and the adaptive array output signal for generating weight values to be applied to the weighting means to automatically redefine the weight factors.

16. A system as in claim 15 further includes a phase adjustment means for adjusting the phase of the reference signal.

17. A system as in claim 15 wherein said means for generating the weight values includes a phase adjustment means for adjusting the phase of the adaptive array output signal.

18. A system as in claim 16 wherein said means for generating the weight values includes a phase adjustment means for adjusting the phase of the adaptive array output signal.

19. A signal processing system for reducing distortion effects in communication receivers due to an interference signal with a signal amplitude less than the signal amplitude of the signal of interest, said system comprising:
LMS adaptive array means having:
at least two antenna elements;
weighting means coupled to the antenna elements for selectively weighting the received signals by a selected weight factor; and
first summing means for adding together the signals from the weighting means for generating an adaptive array output signal; and
amplitude limiter means having as an input signal said adaptive array output signal for generating a reference signal;
said LMS adaptive array means also including a subtractor means coupled to receive the reference signal and the adaptive array output signal for generating an error signal to be applied to the weighting means to automatically redefine the weight factors.

20. A system as in claim 19 wherein said amplitude limiter means includes a phase adjustment means for adjusting the phase of the reference signal.

21. A system as in claim 19 further includes a phase adjustment means for adjusting the phase of the error signal.

22. A system as in claim 20 wherein said subtractor means includes a phase adjustment means for adjusting the phase of the error signal.

23. A system as in claim 19 wherein said subtractor means includes a phase adjustment means for adjusting the phase of the adaptive array output signal.

24. A system as in claim 20 wherein said subtractor means includes a phase adjustment means for adjusting the phase of the adaptive array output signal.

25. A system as in claim 21 wherein said subtractor means includes a phase adjustment means for adjusting the phase of the adaptive array output signal.

26. A system as in claim 22 wherein said subtractor means includes a phase adjustment means for adjusting the phase of the adaptive array output signal.

27. A system as in claim 15 further includes a second summing means for adding together the signals from selected weighting means for generating the reference signal.

28. A system as in claim 19 wherein said amplitude limiter means includes a second summing means for adding together the signals from selected weighting means for generating the reference signal.

* * * * *